(12) United States Patent
Yanevich et al.

(10) Patent No.: US 8,911,163 B1
(45) Date of Patent: Dec. 16, 2014

(54) VARIABLE APERTURE MECHANISM FOR CRYOGENIC ENVIRONMENT, AND METHOD

(71) Applicant: Raytheon Company, Waltham, MA (US)

(72) Inventors: Jeffrey P. Yanevich, Bradenton, FL (US); Eric J. Griffin, Rancho Palos Verdes, CA (US); Michael L. Brest, Goleta, CA (US); Kenneth L. McAllister, Goleta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/170,237

(22) Filed: Jan. 31, 2014

Related U.S. Application Data

(63) Continuation-in-part of application No. 14/088,176, filed on Nov. 22, 2013.

(60) Provisional application No. 61/833,587, filed on Jun. 11, 2013, provisional application No. 61/833,599, filed on Jun. 11, 2013, provisional application No. 61/833,592, filed on Jun. 11, 2013.

(51) Int. Cl.
*G03B 9/08* (2006.01)
*G03B 9/22* (2006.01)

(52) U.S. Cl.
CPC ... *G03B 9/08* (2013.01); *G03B 9/22* (2013.01)
USPC .......................................................... 396/449

(58) Field of Classification Search
CPC ........................................................ G03B 9/22

USPC .......................................................... 396/449
See application file for complete search history.

(56) References Cited

U.S. PATENT DOCUMENTS

| 3,082,674 | A | 3/1963 | Bagby |
|---|---|---|---|
| 4,121,235 | A | 10/1978 | Fujita et al. |
| 4,592,083 | A | 5/1986 | O'Brien |
| 4,995,700 | A | 2/1991 | Barney et al. |
| 5,128,796 | A | 7/1992 | Barney et al. |
| 5,689,746 | A | 11/1997 | Akada et al. |
| 6,133,569 | A | 10/2000 | Shoda et al. |

(Continued)

FOREIGN PATENT DOCUMENTS

GB 2446606 A 8/2008

OTHER PUBLICATIONS

International Search Report dated Feb. 6, 2014 in connection with International Patent Application No. PCT/US2013/068649.

(Continued)

*Primary Examiner* — Clayton E LaBalle
*Assistant Examiner* — Dennis Hancock

(57) ABSTRACT

A device operable in a ultra-high vacuum and in a cryogenic environment. The device has bi-stable solenoid motors configured to drive a shutter assembly defining an aperture having a first shape when the motors are each disposed in the respective first position, and wherein the aperture has a second shape when the motors are each disposed in the respective second position. Actuators responsive to the motors are thermally isolated from the cryogenic shutter assembly except when the motors position the shutter assembly to change a shape of the aperture. The device is suitable for use in FLIR and other thermally sensitive devices.

25 Claims, 11 Drawing Sheets

(56) References Cited

U.S. PATENT DOCUMENTS

| | | | |
|---|---|---|---|
| 6,515,285 B1* | 2/2003 | Marshall et al. | 250/352 |
| 6,995,359 B1 | 2/2006 | Hillenbrand et al. | |
| 2006/0255275 A1 | 11/2006 | Garman et al. | |
| 2007/0279793 A1 | 12/2007 | Hansen et al. | |
| 2008/0030891 A1 | 2/2008 | Kim et al. | |
| 2008/0094728 A1* | 4/2008 | Matsumoto et al. | 359/696 |
| 2010/0053412 A1 | 3/2010 | Sekimoto et al. | |
| 2010/0220988 A1 | 9/2010 | Ohno | |
| 2011/0174979 A1 | 7/2011 | Garman et al. | |
| 2011/0211823 A1 | 9/2011 | Tsai | |

OTHER PUBLICATIONS

Written Opinion of International Searching Authority dated Feb. 6, 2014 in connection with International Patent Application No. PCT/US2013/068649.

"Thermal Control in Variable Aperture Mechanism for Cryogenic Environment", U.S. Appl. No. 14/170,348, filed Jan. 31, 2014.

Office Action dated Mar. 31, 2014 in connection with U.S. Appl. No. 14/170,348.

Kazuhisa Miyoshi, et al., "Durability Evaluation of Selected Solid Lubricating Films", May 2001, 12 pages.

M. A. Sherbiney et al., "Friction and Wear of Ion-Plated Soft Metallic Films", Wear, 45 (1977), pp. 211-220.

S. Jahanmir, et al., "Sliding Wear Resistance of Metallic Coated Surfaces", Wear, 40 (1976), pp. 75-84.

Donald F. King, et al., "3rd-generation MW/LWIR sensor engine for advanced tactical systems", Infrared Technology and Applications XXXIV, Proc. of SPIE, vol. 69402R, 2008, 12 pages.

"Diaphragm (optics)", Wikipedia, Oct. 7, 2012, 4 pages.

"Aperture", Wikipedia, Nov. 4, 2012, 9 pages.

United States Office Action dated Aug. 18, 2014 in connection with U.S. Appl. No. 14/091,128; 14 pages.

Notification of Transmittal of the International Search Report and the Written Opinion of the International Searching Authority, or the Declaration dated Oct. 27, 2014 in connection with International Patent Application No. PCT/US2014/042010.

* cited by examiner

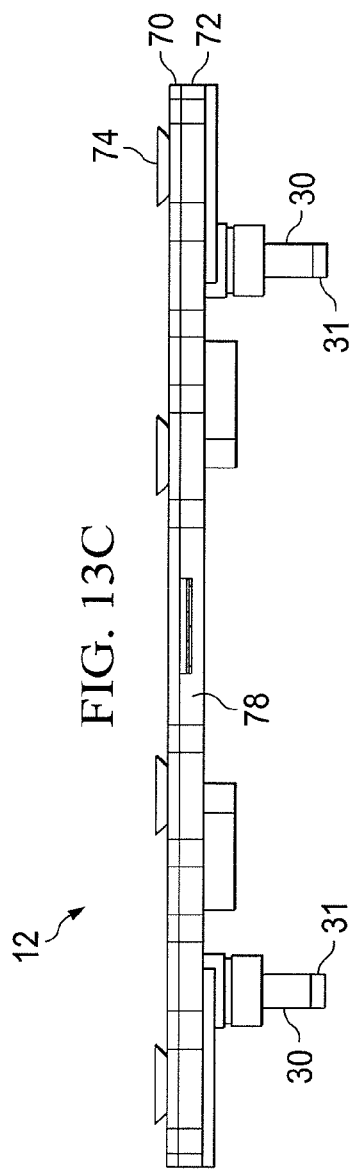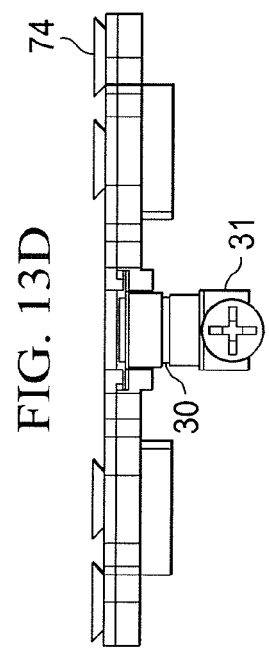

VARIABLE APERTURE MECHANISM FOR CRYOGENIC ENVIRONMENT, AND METHOD

CROSS-REFERENCE TO RELATED APPLICATION(S) AND CLAIM OF PRIORITY

This application is a continuation-in-part of U.S. patent application Ser. No. 14/088,176 entitled "VACUUM STABLE MECHANISM DRIVE ARM" filed Nov. 22, 2013. The present application claims priority to commonly assigned U.S. Provisional Patent Application Ser. No. 61/833,587, filed Jun. 11, 2013, entitled "VARIABLE APERTURE MECHANISM FOR CRYOGENIC ENVIRONMENT, AND METHOD", U.S. Provisional Patent Application Ser. No. 61/833,599, filed Jun. 11, 2013, entitled "THERMAL CONTROL IN VARIABLE APERTURE MECHANISM FOR CRYOGENIC ENVIRONMENT", and U.S. Provisional Patent Application Ser. No. 61/833,592, filed Jun. 11, 2013, entitled "PULSE WIDTH MODULATION CONTROL OF SOLENOID MOTOR. The content of the above-identified patent documents is incorporated herein by reference.

TECHNICAL FIELD

The present disclosure is generally directed to an infrared (IR) imaging mechanism including a shutter having a variable aperture and operable at cryogenic temperatures in an ultra-high vacuum environment that is highly sensitive to temperature variations.

BACKGROUND OF THE DISCLOSURE

Imaging devices configured to operate at cryogenic temperatures in an ultra-high vacuum environment are highly sensitive to temperature variations. Some imaging devices have variably positioned shutters configured to establish different sized apertures, whereby the shutter is mechanically configured to have two or more apertures to support different fields of view and wavelengths. During the mechanical configuration, the shutter increases in temperature due to friction and heat transferred from a drive mechanism. In order for a high definition IR sensor to work correctly, the temperature of the shutter cannot rise more than 10 Kelvin during actuation. Failure to provide shutter thermal stability degrades the imaging performance. For instance, when the temperature of the shutter rises more than 10K, the wait period before the imaging device can be effectively used increases as the shutter temperature variation increases. It is not uncommon for prior art imaging devices to have a wait period that exceeds 10 minutes after shutter configuration.

Prior art devices utilize piezo electric drives that are not suitable for ultra-high vacuum and cryogenic environments, as they have friction that generate particles and are unstable in such conditions. Prior art devices having an interleaved iris design have multiple blades, such as four blades, that are forced together to transfer heat. These interleaved blades are typically ceramic coated, and thus are poor thermal conductors. As a result, the shutter experiences a large change in temperature during each change in position, and significant wait times are incurred while the shutter temperature stabilizes.

SUMMARY OF THE DISCLOSURE

To address one or more of the above-deficiencies of the prior art, one embodiment described in this disclosure comprises a shutter assembly operable in an ultra high vacuum and in a cryogenic environment.

In one embodiment, a device comprises a bi-stable solenoid motor having a motor member, the solenoid motor configured to drive the motor member between a first position and a second position. An actuator is responsive to movement of the motor member from the first position to the second position, and a shutter assembly is responsively coupled to the actuator and defining an aperture having a first shape when the motor member is disposed in the first position, and wherein the aperture has a second shape when the motor member is disposed in the second position, wherein the shutter assembly is configured to operate in a cryogenic environment. In certain embodiments, the actuator is thermally isolated from the shutter assembly except when the motor member moves from the first position to the second position. The actuator comprises an arm having a recess configured to engage the shutter assembly only when the motor member is advanced from the first position to the second position. In certain embodiments, the shutter assembly comprises a first shutter member having a first end disposed in a cavity and a second shutter member having a second end disposed in the cavity. The first end is opposed to the second end and is configured to be selectively advanced towards, and retracted from, the second end so as to define the aperture therebetween having the first shape when disposed in a first position, and wherein the aperture has the second shape when the first end is disposed in a second position. In certain embodiments, the actuator comprises an arm having a recess, and wherein the first shutter member has a drive member disposed in the arm recess. The drive member is configured to be engaged by the arm only when the motor member is advanced from the first position to the second position. In certain embodiments, the shutter assembly comprises a housing defining the cavity, wherein the first shutter member and the second shutter member maintain thermal contact with the housing in all shutter positions. The housing comprises at least one rail, and the first shutter member and the second shutter member maintain thermal contact with the at least one rail in all shutter positions. The housing comprises a sleeve defining the cavity, the sleeve having a pair of opposing planar members thermally coupled to each other around a midsection of the respective planar members by at least one spacer member, wherein the at least one spacer member comprises a stop configured to be thermally coupled to the first shutter member first end and the second shutter member second end when the aperture has the first shape. In another embodiment, a controller is configured to control the solenoid motor and control a velocity of the motor member as the motor member approaches the second position. The controller is configured to measure at least one parameter of the solenoid motor before driving the motor member from the first position to the second position. The solenoid motor may have a coil, and the controller is configured to measure a resistance of the coil, and control the velocity of the motor member as a function of the measured coil resistance. The controller may also be configured to measure an inductance of the coil, and control the velocity of the motor member as a function of the measured coil inductance. In certain embodiments, the controller has a feedback loop configured to control the velocity of the motor member as a function of the measured at least one parameter. The controller may be configured to measure the coil resistance immediately before driving the motor member from the first motor position to the second motor position, and may be configured to measure a back-emf of the solenoid motor to determine the coil resistance.

In another embodiment, a device comprises a first bi-stable solenoid motor having a first motor member and a second bi-stable solenoid motor having a second motor member, each of the first and second solenoid motors configured to drive the respective motor member between a first position and a second position. A first actuator is responsive to movement of the first motor member from the first position to the second position, and a second actuator responsive to movement of the second motor member from the first position to the second position. A shutter assembly is responsively coupled to the first actuator and the second actuator, the shutter assembly defining an aperture having a first shape when the first motor member and the second motor member are each disposed in the respective first position, and wherein the aperture has a second shape when the first motor member and the second motor member are each disposed in the respective second position, wherein the shutter assembly is configured to operate in a cryogenic environment. In certain embodiments, the first actuator and the second actuator are thermally isolated from the shutter assembly except when the first motor member and the second motor member each move from the respective first position to the respective second position. The first actuator and the second actuator each comprise an arm having a recess configured to engage the shutter assembly only when the first motor member and the second motor member each move from the respective first position to the respective second position. In certain embodiments, the shutter assembly comprises a first shutter member responsively coupled to the first actuator arm and a second shutter member responsively coupled to the second actuator arm, each of the first shutter member and the second shutter member configured to be selectively advanced towards, and retracted from, each other so as to define the aperture therebetween having the first shape when each of the first and second solenoid motors are disposed in the first position, and wherein the aperture has the second shape larger than the first shape when each of the first and second solenoid motors are disposed in the second position. In another embodiment, the first actuator and the second actuator each comprise an arm having a recess, wherein the first shutter member has a first drive member disposed in the first actuator arm recess and the second shutter member has a second drive member disposed in the second actuator arm recess, wherein each of the first and second drive members are configured to be engaged by the respective first and second actuator arms only when the respective motor members are advanced from the respective first position to the second position. In certain embodiments, the shutter assembly comprises a housing defining the cavity, wherein the first shutter member and the second shutter member maintain thermal contact with the housing in all positions. The housing comprises a sleeve defining the cavity, the sleeve having a pair of opposing planar members thermally coupled to each other around a midsection of the respective planar members by at least one spacer member. The at least one spacer member comprises a stop configured to be thermally coupled to the first shutter member and the second shutter member when the aperture has the first shape. In certain embodiments, a controller is configured to control the first and second solenoid motors and control a velocity of the first and second motor members as the first and second motor members approach the respective second positions. The controller is configured to measure at least one parameter of the first and second solenoid motors before driving the respective first and second motor members from the first position to the second position. The controller has a feedback loop configured to control the velocity of the first and second motor members as a function of the measured at least one parameter.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 13A-13D illustrate different view of the shutter assembly;

DETAILED DESCRIPTION

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

Figure 1:
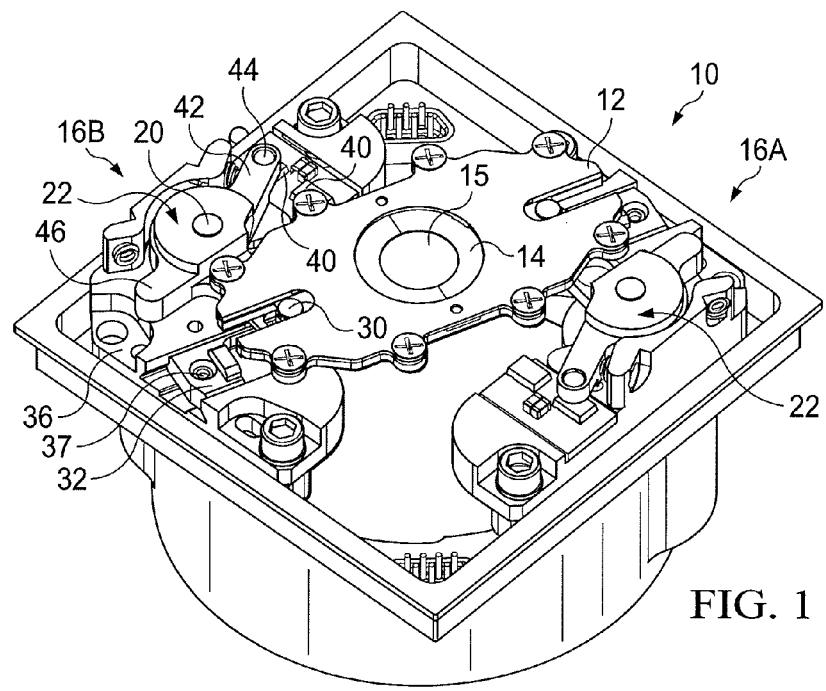
FIG. 1 illustrates a thermal imaging device including a shutter and a thermally isolated drive system configured to position the shutter according to an embodiment of the present disclosure.

FIG. 1 illustrates a top perspective view of an IR thermal imaging shutter apparatus 10 including a variable aperture mechanism (VAM) operable at ultra-high vacuum and cryogenic temperature. Apparatus 10 includes a shutter assembly generally shown at 12 comprising a pair of sliding aperture blades 14. The sliding aperture blades 14 together define a shutter aperture 15, and each blade 14 is configured to be driven by a respective drive mechanism generally shown at 16A and 16B to selectively establish a shape of the aperture 15. The aperture blades 14 are each enclosed in a cavity defined between a pair of thermally conductive members defining a sleeve, each aperture blade 14 having two positions, a closed position to define the aperture 15 having a smaller shape as shown in FIG. 1, and a retracted position to define a larger shape aperture 15 (not shown) such that the aperture 15 is configured to work with an imaging device (not shown) having at least two different fields of view as will be described in more detail shortly with respect to FIG. 4 and FIGS. 11-14. The shutter assembly 12 is advantageously configured to operate at a cryogenic temperature in a high-vacuum environment, whereby the blades 14 maintain a thermally stable temperature both at rest and during a transition between positions, and which blades 14 are thermally isolated from the non-cooled apparatus 10 elements, such as the drive mechanism 16A and 16B, and the ambient which is critical such that the imaging device can be immediately used after aperture shape changes without a significant wait time, as will be detained shortly in respect to FIG. 4 and FIGS. 11-15.

Each drive mechanism 16A and 16B comprises a rotary motor 18 (see FIG. 3) preferably comprising a bi-stable solenoid. The bi-stable solenoid provides critical advantageous over conventional piezo electric drives because it is vacuum stable in an ultra high vacuum environment and highly reliable, such as for use in forward looking infrared (FLIR) devices. The bi-stable solenoid has internal retention magnets that provide passive shock and vibration stability, whereas a piezo electric drive has friction retention. Moreover, the bi-stable solenoid is capable of more power output by increasing its drive current, whereas a piezo electric drive provides a single force output. In addition, the bi-stable solenoid is 10× faster than the piezo electric drive, and does not generate foreign object debris (FOD), unlike the piezo electric drive having friction that undesirably creates particles during operation. The bi-stable solenoid is easy to install in apparatus 10, and requires reduced material and labor cost. The bi-stable solenoid in conjunction with the variable aperture shutter assembly operable at cryogenic temperatures provides significant technical advantages.

Figure 2:
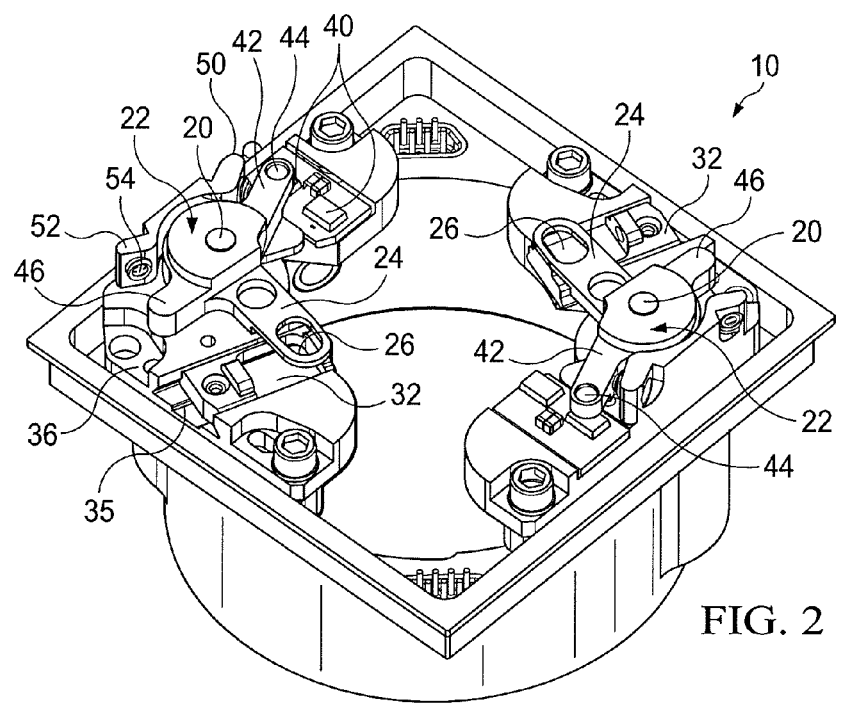
FIG. 2 illustrates the thermally isolated drive system of FIG. 1 with the shutter removed.
Figure 5:
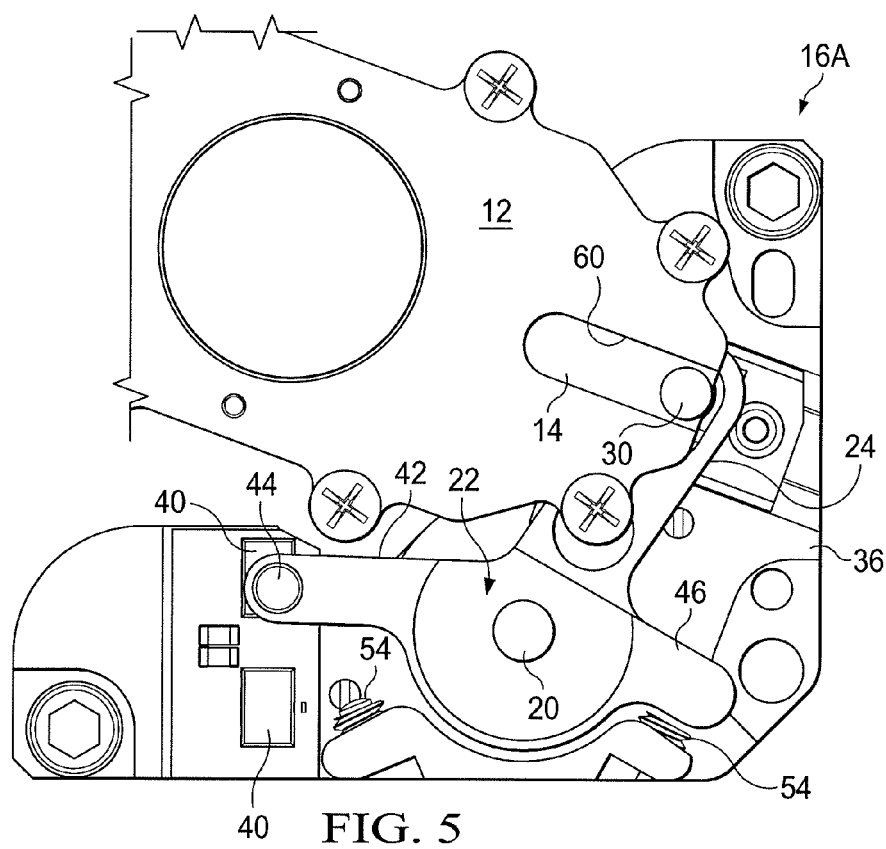
FIG. 5 illustrates the drive arm in a first "full open" position wherein the shutter slider member is in a corresponding first position.
Figure 6:
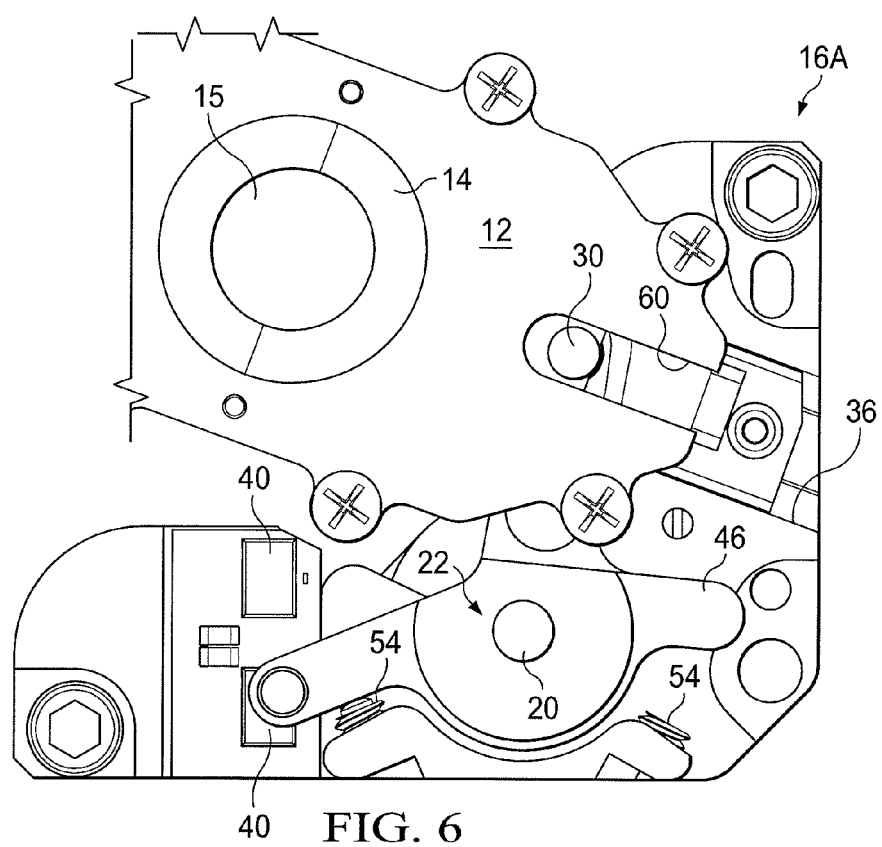
FIG. 6 illustrates the drive arm in a second "full closed" position wherein the shutter slider member is in a corresponding second position.

Each drive mechanism 16A and 16B has a rotatable actuator pin 20 coupled to and driving a balanced rotatable drive crank 22. Each drive crank 22 has a radially extending elongated arm 24 (see FIG. 2), configured to selectively rotate arm 24 between a first "full open" position and a second "full closed" position as shown in FIG. 5 and FIG. 6, as will be discussed shortly. Each arm 24 has a distal end having a recess 26, as shown in FIG. 2, the recess 26 preferably comprising an elongated opening in one preferred embodiment as shown. The recess 26 could also comprise a slot or other open ended structure if desired, and limitation to an opening is not to be inferred.

Each arm recess 26 is configured to receive, but is spaced from, a respective positioning member 30 and roller 34 (see FIG. 4) rotatably disposed thereabout. Each member 30 preferably comprises a shutter pin secured to, and thermally coupled with, one respective end of the aperture blade 14 formed as a triangle and opposite the blade end defining the aperture 15 as shown in FIG. 4. This triangular shape of the aperture blade proximate the respective member 30, and the separation of each member 30 from the opposing blade end, helps isolate any heat created on member 30 during aperture positioning from the blade aperture ends proximate the imaging device to reduce imaging degradation due to such heat. Each member 30 extends downwards and is connected to a magnet 31 that remains physically and thermally separated above a respective magnetic detent latch 32. Each detent latch 32 is securingly and slidably received in a respective slot 35 (see FIG. 3) defined in a frame 36. Each detent latch 32 is preferably comprised of a plug configured to slide linearly inside the corresponding slot 35 in frame 36, and locked into position when positioned in the final desired location by a set screw 37 pressing the plug upwards into slot 35, providing an accessible locking feature while inducing minimal additional linear motion. Upon rotation of the arms 24, the respective openings 26 engage the respective roller 34 encompassing the respective shutter pin 30 to linearly move the aperture blade 14 between a first full open position and a second full closed position, wherein the roller 34 rotates in the opening 26 during transition, and is then spaced therefrom at the end of the transition.

FIG. 2 depicts the apparatus 10 with the shutter apparatus 12 removed, illustrating the drive mechanisms 16A and 16B including the respective arms 24 having openings 26, the magnetic detent latches 32 without shutter pins 30, as well as two pairs of proximity sensors 40 (see FIG. 3) to indicate the final position of each respective arm 24, preferably comprised of Hall effect sensors. Each drive crank 22 has a proximity indicating arm 42 including a magnet 44 disposed at a distal end therein and selectively extending over one of the proximity sensors 40 as a function of the arm 24 position. When the arm 24 is in the first full open position as shown in FIG. 5, the first proximity sensor 40 indicates the drive crank 22 is in place at the open position, and when the arm 24 is in the second full closed position as shown in FIG. 6, the second proximity sensor 40 indicates the drive crank 22 is in place at the closed position. Magnetic cogging, created internally to the actuator 18 and in the detent magnetic latch 32, forces the arms 42 and 46 against the set screws 54 in stops 50 and 52 and prevents any play at the end of travel.

Figure 3:
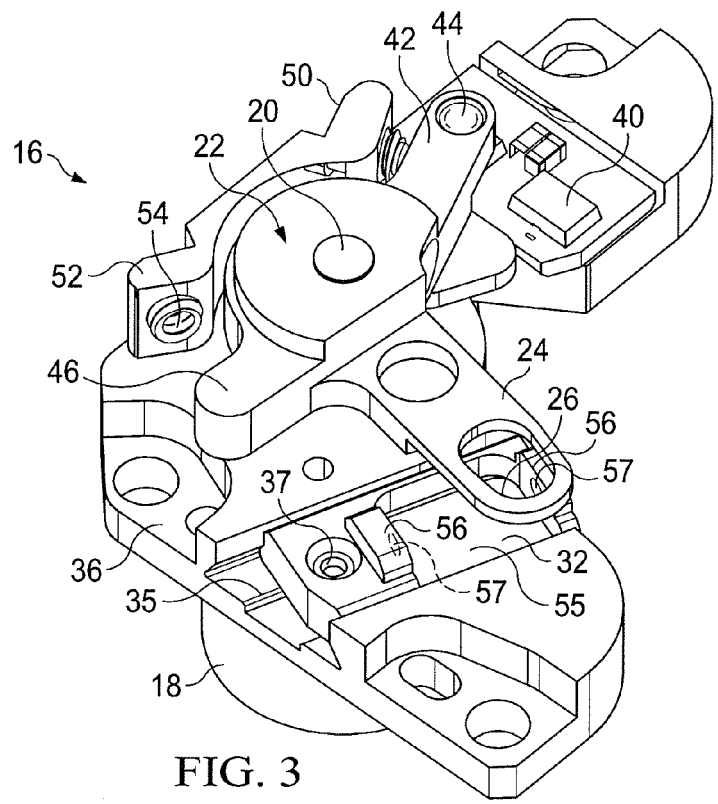
FIG. 3 illustrates a perspective view of one drive mechanism.
Figure 4:
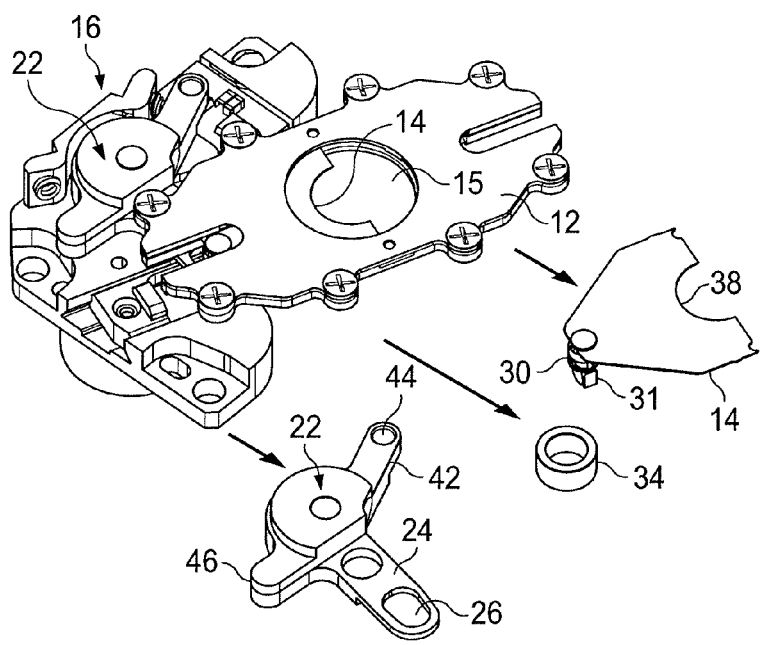
FIG. 4 illustrates an exploded view of part of the drive system illustrating the drive arm having an elongated recess configured as an opening to receive a drive pin and roller of the shutter slider member.
Figure 14A:
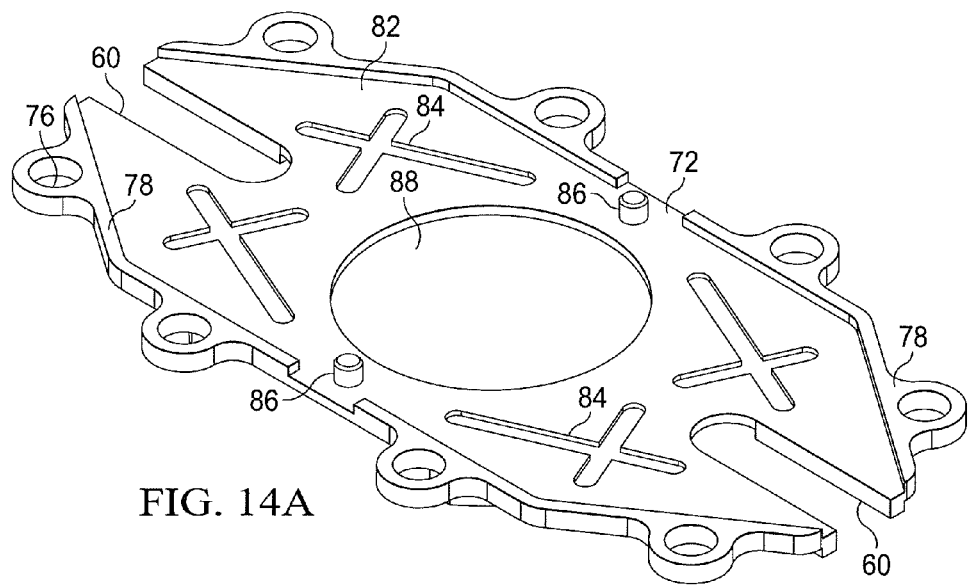
FIG. 14A-14B illustrate top and bottom views of the lower plate of the shutter assembly.

FIG. 3 depicts a perspective view of one drive mechanism 16 with arm 24 positioned in the second position, illustrating the travel path of the arm, which may be, for instance, 24 degrees, although limitation to this path is not to be inferred. The detent magnetic latch 32 is comprised of a non-magnetic metal, such as stainless steel, and is seen to have a recess 55 and a pair of end stops 56, with one end stop 56 defined on each end of the recess 55. A magnet 57 is attached to, or embedded in, the opposing faces of end stops 56. The magnets 57 are each configured to magnetically pull the respective magnet 31, and thus pin 30 and associated roller 34 (FIG. 4), when the magnet 31 is advanced by arm 24 proximate thereto. When arm 24 advances from the first position (FIG. 5) to the second position (FIG. 6), stop 50 prevents further movement of the arm 24 but the momentum of the pin 30, magnet 31, roller 34 and the associated shutter blade 14 are allowed to continue moving until the blade 14 fully closes and engages a pair of stop members 86 of shutter assembly 12, as shown in FIG. 14A and will be described in more detail shortly. The magnet 31, however, will not make physical contact with the respective magnet 57 and will remain closely proximate and magnetically attracted to magnet 31 to provide a magnetic latch. Basically, the arm 24 undershoots, and the pin 30, magnet 31 and roller 34 advance to separate from the opening 26 and remain thermally isolated from the arm 24, and the stop members 86 limit the travel of pin 30 from overshooting and engaging the other edge of opening 26. Likewise, when the arm 24 advances from the second position to the first position, stop 52 prevents further movement of the arm 24 but the momentum of pin 30, magnet 31, roller 34 and the associated blade 14 are allowed to continue moving until the blade 14 fully opens and engages a pair of sidewalls 78, as shown in FIG. 14A. The magnet 31, however, will not make physical contact with the respective magnet 57 and will remain closely proximate and magnetically attracted to magnet 31 to provide a magnetic latch.

FIG. 4 depicts an exploded view of one drive mechanism 16 and one end of one shutter blade 14 configured to be positioned as a function of the drive mechanism positions. Each shutter blade 14 is very thin and lightweight to help reduce friction. The shutter pin 30 consists of a cylindrical post which captures roller 34 comprising a bushing to prevent sliding along the distal slot 26, wherein roller 34 rolls against the edges of slot 26 to prevent friction and wear. The magnet 31 is provided below shutter pin 30 and provides a magnetic detent pulling when in close proximity, but not contacting and thermally isolated from, to the arms of the detent magnetic latch 32. Each shutter blade 14 has a semicircular notch 38 configured to define the smaller diameter of aperture 15 in the closed position. Each notch 38 may be configured to define a round aperture as shown, by may also have different shapes to define different aperture shapes, such as hexagon, rectangular, elliptical and other shapes.

Figure 9:
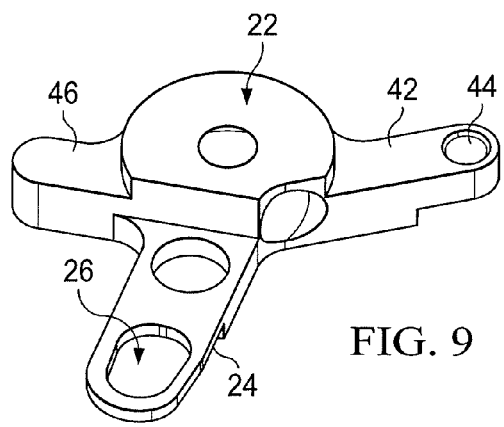
FIG. 9 illustrates a perspective view of the drive crank including the arms.

Each drive crank 22 further comprises a radially extending arm 46, wherein each of arms 42 and 46 are shorter than the elongated arm 24 as shown in FIGS. 5 and 6, as well as FIG. 9. Each of arms 24, 42, and 46 are balanced about the center of the drive crank 22, such that the center of gravity of drive crank 22 is balanced when coupled to the respective actuator pin 20. This makes system 10 far less sensitive to extremely high shock requirements. Each arm 42 and 46 has a travel stop limit comprising a stop member 50 and 52, respectively, of which each contains an adjustable travel limit set screw 54. Stop member limit screws 54 in turn establish the precise travel path and limit of arm 24, and thus the precise limit position of the driven shutter plate 14. Again, proximity sensors 40 sensing arm 42 indicate whether the drive crank 22, and thus the arm 24 and shutter plate 14, is in one of two positions.

When the shutter plate 14 is in the full open position, the arm 24 of drive mechanism 16A is in the full open position and the shutter pin 30 of drive mechanism 16A is positioned at a distal end of a slot 60 defined in one end of plate 12 as shown in FIG. 5. Correspondingly, the arm 24 of drive mechanism 16B is in the full open position, and the shutter pin 30 of the drive mechanism 16B is outwardly advanced in an opposing slot 60 defined at the opposing end of plate 12. The converse is true when the shutter plates 14 are in the closed position, as can be seen in FIG. 1 and FIG. 6.

Figure 7:
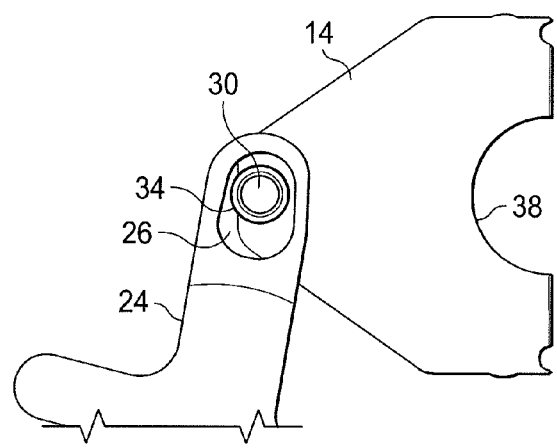
FIG. 7 illustrates a top view of the arm and elongated opening receiving, but physically and thermally separated from, the slider pin and roller in the first and second position.
Figure 8:
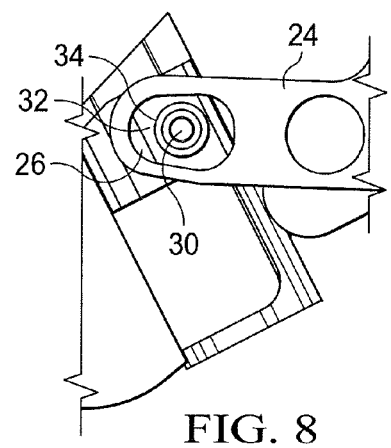
FIG. 8 illustrates a top view of the arm in the first position showing the asymmetric clearance of the arm from the slider pin and roller, including the radial play of the actuator compared to this clearance.

Advantageously, as illustrated in FIG. 7 and FIG. 8, each shutter pin 30 and the corresponding roller 34 remain physically and thermally separated from the respective arm 24 when in the first position and the second position due to a spacing created there between in both positions, thus creating a thermal barrier, also referred to as thermal isolation. The arm 24 only engages the rollers 34 disposed about the shutter pin 30 for a very short time period during movement/actuation of the shutter plate 14 from one position to the other. Thus, the drive mechanisms 16A and 16B and all parts thereof are thermally isolated from the driven shutter plate 14 when in the operable full open or full closed position. The shutter mechanism including the plate 12 and shutter plate 14 are preferably configured in a vacuum having a true IR Dewar cryogenic environment.

Moreover, the spacing of the arms 24 from rollers 34 provides the motors 18, and thus the respective arms 24, time to accelerate from the respective first rest position or second rest position which advantageously builds momentum in the arms 24 before engaging and driving the respective rollers 34, converting the actuation mechanism from torque transfer to momentum transfer of energy. This additional momentum helps overcome the magnetic detent forces of the magnetic detent latch 32 acting against the shutter pin 30, holding arms 42 or 46 against the stop posts 50 or 52. The impact of the arm 24 engaging the roller 34 during rotation also helps overcome any stiction that may be present. This spacing increases the required force margin from 25% to 900%. The spacing also allows the use of a less precise solenoid motor 18, which has a relatively large amount of play and thus is less suitable for driving the arm 24 directly. Each arm opening 26 provides a loose fitting about the respective shutter pin 30 and roller 34, such that the motor loose play does not impair operation of the shutter aperture. Conversely, the loose tolerances of the arm openings 26 mitigate the risk of an inadvertent rebound. The aperture blades 14 have internal stops, which engage prior to the holding arms 42 or 46 contacting their respective stop. Since the shutter pin 30 is not firmly engaged within the distal slot 26, the aperture blade can rebound before the arm 42 or 46 contacts the stop set screw 54 and rebounds. Additional margin is provided by the fact that the arm has much higher inertia than the aperture blade, and rebounds correspondingly slower. The high level of damping in the actuator bearings in 18 diminishes the magnitude of the arm rebound. These features prevent a situation where the rebounding arm 24 impacts the shutter pin 30 and roller 34 while traveling in the opposite direction. Such impact could exert extremely high forces onto the shutter pin 30 due to the arm's much higher inertia.

As shown in FIG. 8, the clearance between the respective roller 34 and arm opening 26 is slightly asymmetric, although it may be symmetric if desired. In one preferred implementation, there is about 1.4 degrees of clearance, also referred to as a dead zone, equating to about a 0.011 inch clearance, although limitation to this angular spacing or clearance is not to be inferred. The arm travel limit set stops established by screws 54 are preferably set to detent to within ⅕ of the dead zone, about 0.28 degrees.

In one preferred embodiment, a rotary solenoid is used as motor 18 as it provides consistent reliability and an adjustable stroke, such as manufactured by Brandstrom Instruments of Ridgefield Conn. The fine adjustment features of the drive crank 22 using the travel limit screws 54 in the stationary motor mount stop limit members 50 and 52 help establish this stroke. This design is superior to a piezo drive motor that is inherently unreliable, although is functionally acceptable. Alternate rotary motors could comprise DC stepper motors, and limitation to the particular rotary motor is not to be inferred. This invention has advantages over motors and linkages that may allow motor over-travel which may overstress driven parts.

FIG. 9 illustrates a perspective view of the drive crank 22, including the four balanced arms.

Figure 10:
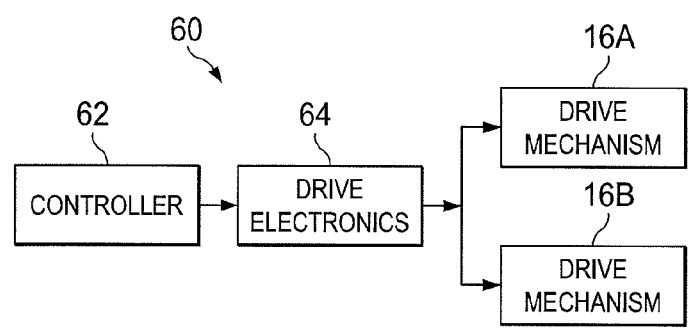
FIG. 10 illustrates a controller circuit configured to control the drive assembly.

FIG. 10 illustrates a control circuit at 60 that is configured to selectively drive each of motors 18, to control the positioning of the arms 24 and thus drive the shutter plate 14 between the first and second positions. The control circuit includes a controller 62 having a processor configured to control drive electronics 64 that interface with motors 18 of drive mechanisms 16A and 16B.

Figure 11:
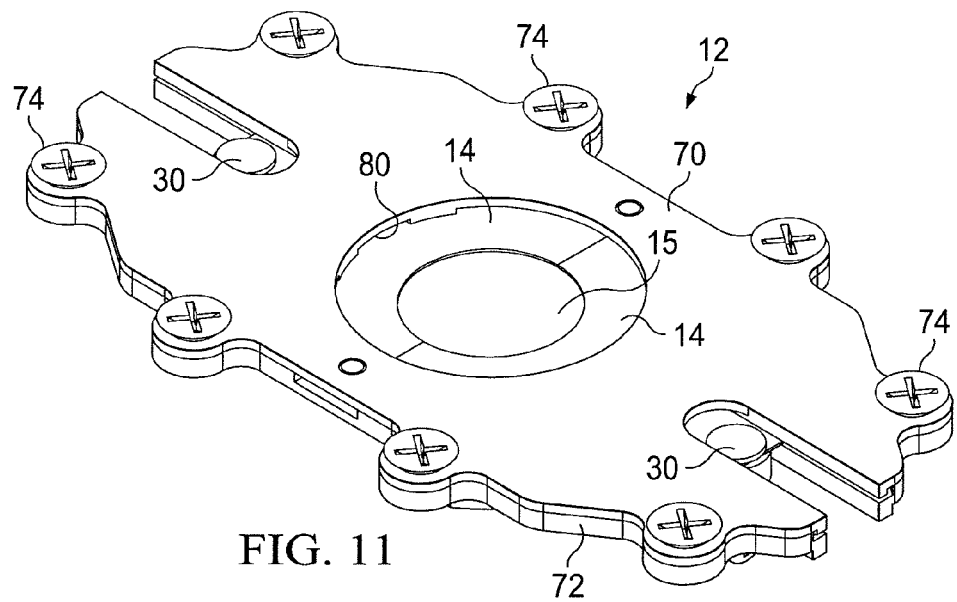
FIG. 11 illustrates a top perspective view of the shutter assembly.
Figure 12:
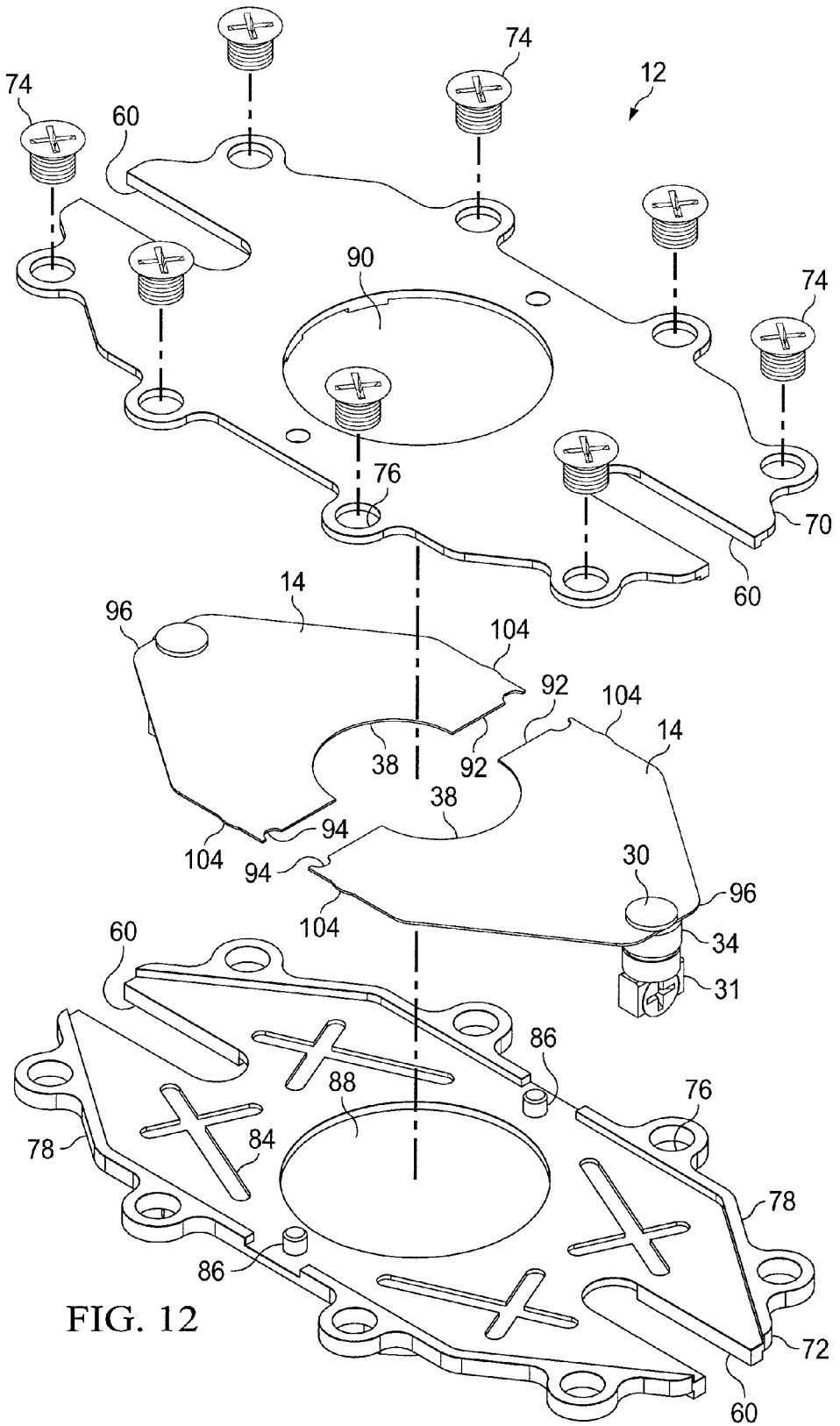
FIG. 12 illustrates an exploded view of the shutter assembly.
Figure 13A:
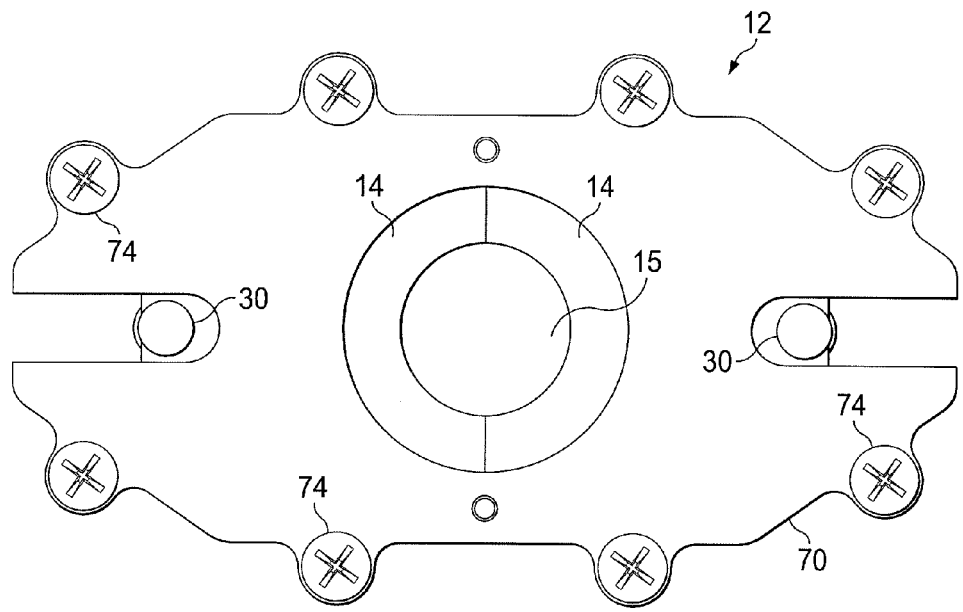
Figure 13B:
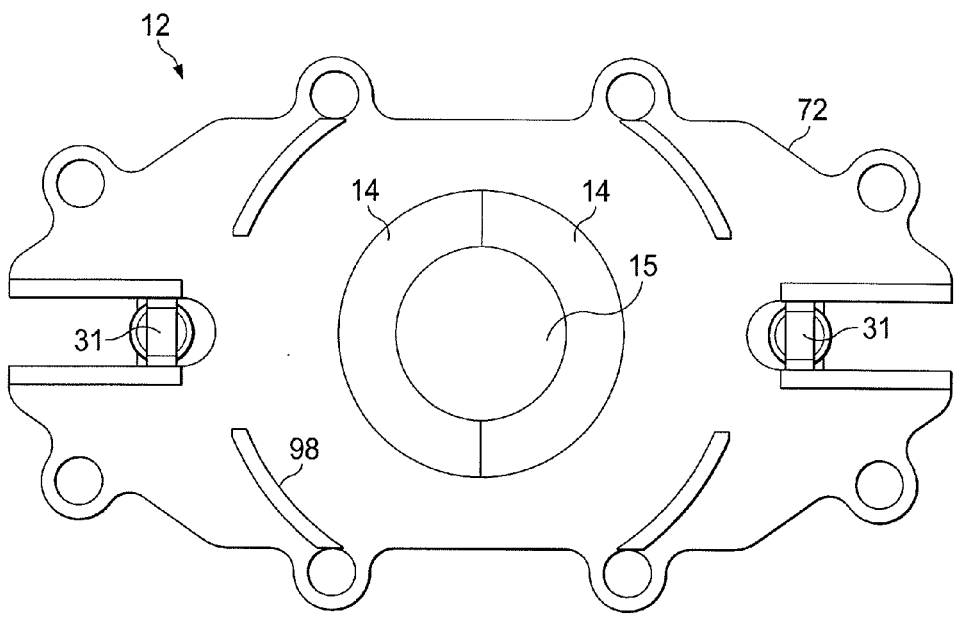

Referring now to FIG. 11, there is shown a top perspective view of the shutter assembly 12. FIG. 12 shows an exploded view of the shutter assembly 12. FIG. 13A shows a top view of shutter assembly 12, FIG. 13B shows a bottom view of shutter assembly 12, FIG. 13C shows a side view of shutter assembly 12, and FIG. 13D shows an end view of shutter assembly 12. Shutter assembly 12 comprises a top plate 70 and a bottom plate 72 parallel to each other and secured by a plurality of fasteners 74, shown as screws, extending through respective flange openings 76. The bottom plate 72 has four upwardly extending sidewalls 78 about the perimeter thereof such that top plate 70 and bottom plate 72 together define a sleeve having a cavity 80 there between. Cavity 80 is configured to house the shutter blades 14 and enable sliding of the blades 14 between two positions to define two different diameters of aperture 15. Each of top plate 70 and bottom plate 72 have opposing slots 60 as previously described to enable shutter pins 30 to be selectively positioned therein and establish the aperture 15 setting. Top plate 70 and bottom plate 72 are comprised of thermally conductive materials, such as beryllium copper, and are configured such that any generated heat uniformly transfers therethrough and equalizes around the shutter assembly 12 as it is maintained at a cryogenic temperature. For instance, any heat generated in the shutter pin 30 or roller 34 during positioning of blades 14 to change aperture 15 settings quickly spreads to the other members to maintain a stable temperature, which is critical to allow the high definition infrared (IR) sensor (not shown) operating with the aperture 15 to be used promptly after setting.

Each of the shutter blades 14 are comprised of a very thin metal material, such as beryllium copper, and in addition, are gold plated. Advantageously, the gold plating provides self-lubrication to the blades 14 without using an oil or grease that is not suitable for use at cryogenic temperatures. The gold plating also reflects heat such as that generated by the imaging system at aperture 15. The gold plating also prevents foreign object debris (FOD) as it is very soft.

Each blade 14 has a rounded extension or nub 104 on an edge thereof configured to engage the respective sidewall 78 of bottom plate 72, wherein the nubs 104 provide the only contact points with sidewall 78 to reduce friction during positioning, but also advantageously provide a thermal path. The sliding blades 14 maintain thermal conduction with upper member 70 and lower member 72 at all times including during a transition due to the multi-point high thermal conductive paths. Again, the gold plating of blade 14 provides lubrication at these contact points. All materials of shutter assembly 12 are vacuum stable in an enclosed environment.

Figure 14B:
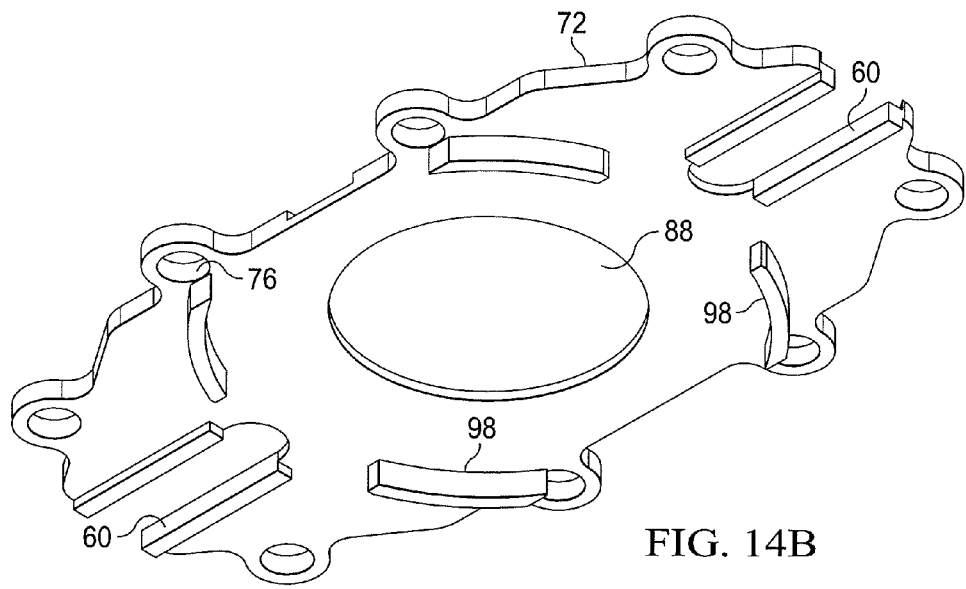

FIG. 14A illustrates a top perspective view of bottom plate 72 and FIG. 14B illustrates a bottom perspective view of bottom plate 72. A top surface 82 of bottom plate 72 is seen to comprise a plurality of X-shaped recesses 84 configured to operate as particle traps. Each recess 84 is formed during molding or by etching, and is configured to collect and capture particles that may be generated as the blades 14 are positioned over time. In addition, the magnets 31 coupled to shutter pins 30 magnetize the shutter pins 30 and also collect any particles that may be generated.

Bottom plate 72 is further seen to comprise a pair of posts 86 opposed each side of opening 88, which opening 88 provides the larger shape of aperture 15 when the blades 14 are in the retracted position. Top plate 70 has opening 90 having a larger diameter (clearance hole) while opening 88 has a controlled aperture hole. Each of blades 14 is seen to have opposing distal ends 92 forming edges including opposing notches 94, as shown in FIG. 12. The opposing notches 94 of blades 14 are configured to mechanically and thermally engage the respective posts 86 in the closed position, which posts 86 operate as stop limits for the blades 14, and also shutter pin 30 and roller 34 as described earlier with respect to FIG. 3. Moreover, the posts 86 help thermally balance the shutter assembly 12 when the blades 14 engage them, and also help balance any heat between the opposing top plate 70 and the bottom plate 72. The sidewalls 78 provide the stop limits for the blades 14 in the open position, and also shutter pin 30 and roller 34 as described earlier with respect to FIG. 3.

Each blade 14 has a tapered, triangular end 96 mechanically and thermally coupled to respective shutter pin 30 such that any heat generated in shutter pin 30 is as far as possible from the opposing distal ends 92 to minimize thermal variations at distal ends 92 that can degrade the performance of the imaging system. The distal ends 92 are each beveled, and slightly overlap one other in the closed position to prevent any light passing across the interface of the blades 14 in the closed position. The beveled distal ends 92 also allow one blade distal end to slightly ride on the other in the closed position, which may occur over time during operation of the shutter assembly 12.

The bottom plate 72 has a plurality of semicircular extensions 98 that are configured to receive a cryogenic housing configured to maintain the shutter assembly 12 at a cryogenic temperature, as shown in FIG. 14B.

Figure 15A:
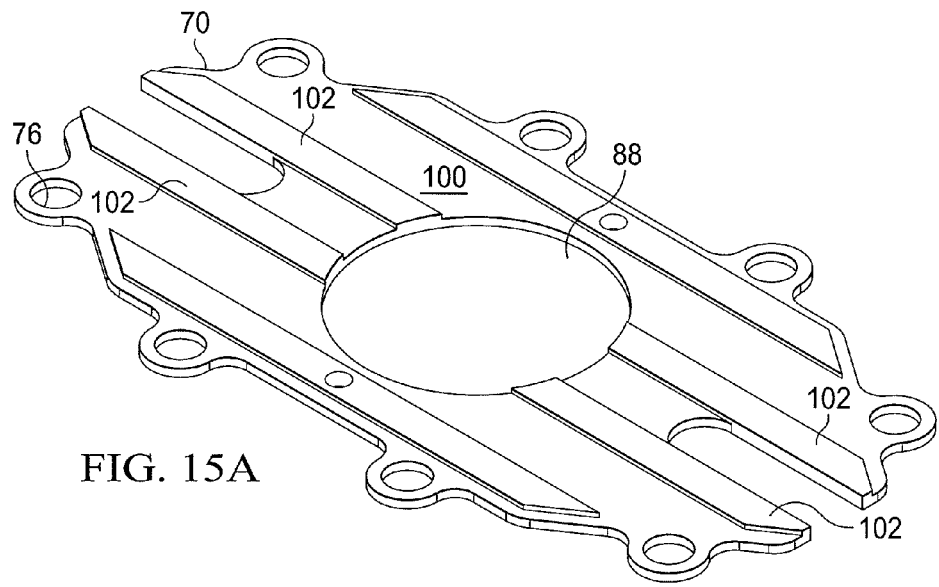
FIG. 15A illustrates a perspective view of the top plate flipped to show the lower surface thereof.
Figure 15B:
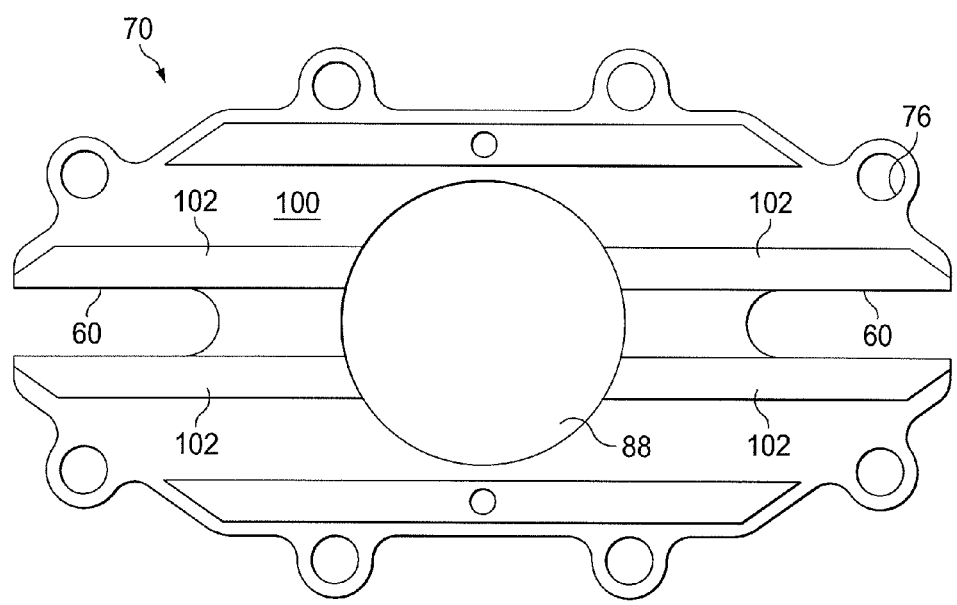
FIG. 15B illustrates a view of the top plate lower surface.

Referring to FIG. 15A there is shown a perspective view of the top plate 70 with the top plate 70 turned over to show a lower surface 100 of the top plate 70. FIG. 15B shows a top view of the flipped top plate 70. The lower surface 100 is seen to have a pair of parallel slide rails 102 each side of opening 88, each rail 102 extending upward and configured to engage the top surface of the opposing gold plated blades 14. The slide rails 102 also partially straddle the respective opening 60. Advantageously, the gold plating is relatively soft and provides a self-lubricating surface, such that very low friction is generated between the rails 102 and the surface of the blades 14 during transitions. Moreover, the soft gold material does not generate any noticeable gold particulates.

The shutter assembly is configured to operate at cryogenic temperatures, below 100 Kelvin. The shutter assembly 12 maintains at least a 200 Kelvin temperature differential from the non-cooled parts including the driving mechanism parts. Advantageously, the shutter assembly 12 is configured such that the blades 14 are thermally stable and do not change temperature more than 10 Kelvin, particularly at edges 92, which is critical such that a high definition infrared (IR) imaging system can be used immediately after transitions of the blades 14 from one aperture setting to the other. The sliding blades 14 maintain continuous thermal contact without increased friction. This exceptional performance is achieved by numerous critical features including the gold plating of the blades providing a self-lubricating low friction surface at cryogenic temperatures, the pins 30 coupled to a triangular tapered end of the blades 14 at the far ends of the blades from the aperture, the thermal isolation of the driving mechanism from the shutter assembly 12 achieved by the separation of pin 30 and roller 34 from the shutter assembly 12 except during transition, and the thin blades 14 minimizing friction and reflecting any heat.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A device, comprising:
a bi-stable solenoid motor having a motor member, the solenoid motor configured to drive the motor member between a first position and a second position;
an actuator responsive to movement of the motor member from the first position to the second position; and
a shutter assembly responsively coupled to the actuator and defining an aperture having a first shape when the motor member is disposed in the first position, and wherein the aperture has a second shape when the motor member is disposed in the second position, wherein the shutter assembly is configured to operate in a cryogenic environment,
wherein the actuator is thermally isolated from the shutter assembly except when the motor member moves between the first position to the second position.

2. The device as specified in claim 1 wherein the actuator comprises an arm having a recess configured to engage the shutter assembly only when the motor member is advanced from the first position to the second position.

3. The device as specified in claim 1 wherein the shutter assembly comprises a first shutter member having a first end disposed in a cavity and a second shutter member having a second end disposed in the cavity, the first end opposed to the second end and configured to be selectively advanced towards, and retracted from, the second end so as to define the aperture therebetween having the first shape when disposed in a first position, and wherein the aperture has the second shape when the first end is disposed in a second position.

4. The device as specified in claim 3 wherein the actuator comprises an arm having a recess, and wherein the first shutter member has a drive member disposed in the arm recess, wherein the drive member is configured to be engaged by the arm only when the motor member is advanced from the first position to the second position.

5. The device as specified in claim 3 wherein the shutter assembly comprises a housing defining the cavity, wherein the first shutter member and the second shutter member maintain thermal contact with the housing in all positions.

6. The device as specified in claim 5 wherein the housing comprises at least one rail, and the first shutter member and the second shutter member maintain thermal contact with the at least one rail in all shutter positions.

7. The device as specified in claim 6 wherein the housing comprises a sleeve defining the cavity, the sleeve having a pair of opposing planar members thermally coupled to each other around a midsection of the respective planar members by at least one spacer member.

8. The device as specified in claim 7 wherein the at least one spacer member comprises a stop configured to be thermally coupled to the first shutter member first end and the second shutter member second end when the aperture has the first shape.

9. The device as specified in claim 1 further comprising a controller configured to control the solenoid motor and control a velocity of the motor member as the motor member approaches the second position.

10. The device as specified in claim 9 wherein the controller is configured to measure at least one parameter of the solenoid motor before driving the motor member from the first position to the second position.

11. The device as specified in claim 10 wherein the solenoid motor has a coil, and the controller is configured to measure a resistance of the coil, and control the velocity of the motor member as a function of the measured coil resistance.

12. The device as specified in claim 10 wherein the solenoid motor has a coil, and the controller is configured to measure an inductance of the coil, and control the velocity of the motor member as a function of the measured coil inductance.

13. The device as specified in claim 10 wherein the controller has a feedback loop configured to control the velocity of the motor member as a function of the measured at least one parameter.

14. The device as specified in claim 11 wherein the controller is configured to measure the coil resistance immediately before driving the motor member from the first motor position to the second motor position.

15. The device as specified in claim 11 wherein the controller is configured to measure a back-emf of the solenoid motor to determine the coil resistance.

16. A device, comprising:
a first bi-stable solenoid motor having a first motor member and a second bi-stable solenoid motor having a second motor member, each of the first and second solenoid motors configured to drive the respective motor member between a first position and a second position;
a first actuator responsive to movement of the first motor member from the first position to the second position, and a second actuator responsive to movement of the second motor member from the first position to the second position; and
a shutter assembly responsively coupled to the first actuator and the second actuator, the shutter assembly defining an aperture having a first shape when the first motor member and the second motor member are each disposed in the respective first position, and wherein the aperture has a second shape when the first motor member and the second motor member are each disposed in the respective second position, wherein the shutter assembly is configured to operate in a cryogenic environment,
wherein the first actuator and the second actuator are thermally isolated from the shutter assembly except when the first motor member and the second motor member each move between the respective first position to the respective second position.

17. The device as specified in claim 16 wherein the first actuator and the second actuator each comprise an arm having a recess configured to engage the shutter assembly only when the first motor member and the second motor member each move from the respective first position to the respective second position.

18. The device as specified in claim 17 wherein the shutter assembly comprises a first shutter member responsively coupled to the first actuator arm and a second shutter member responsively coupled to the second actuator arm, each of the first shutter member and the second shutter member configured to be selectively advanced towards, and retracted from, each other so as to define the aperture therebetween having the first shape when each of the first and second solenoid motors are disposed in the first position, and wherein the aperture has the second shape larger than the first shape when each of the first and second solenoid motors are disposed in the second position.

19. The device as specified in claim 18 wherein the first actuator and the second actuator each comprise an arm having a recess, wherein the first shutter member has a first drive member disposed in the first actuator arm recess and the second shutter member has a second drive member disposed in the second actuator arm recess, wherein each of the first and second drive members are configured to be engaged by the respective first and second actuator arms only when the respective motor members are advanced from the respective first position to the second position.

20. The device as specified in claim 16 wherein the shutter assembly comprises a housing defining the cavity, wherein the first shutter member and the second shutter member maintain thermal contact with the housing in all positions.

21. The device as specified in claim 20 wherein the housing comprises a sleeve defining the cavity, the sleeve having a pair of opposing planar members thermally coupled to each other around a midsection of the respective planar members by at least one spacer member.

22. The device as specified in claim 21 wherein the at least one spacer member comprises a stop configured to be thermally coupled to the first shutter member and the second shutter member when the aperture has the first shape.

23. The device as specified in claim 16 further comprising a controller configured to control the first and second solenoid motors and control a velocity of the first and second motor members as the first and second motor members approach the respective second positions.

24. The device as specified in claim 23 wherein the controller is configured to measure at least one parameter of the first and second solenoid motors before driving the respective first and second motor members from the first position to the second position.

25. The device as specified in claim 24 wherein the controller has a feedback loop configured to control the velocity of the first and second motor members as a function of the measured at least one parameter.

\* \* \* \* \*